(12) United States Patent
Shroff et al.

(10) Patent No.: US 9,443,041 B2
(45) Date of Patent: *Sep. 13, 2016

(54) SIMULATION SYSTEM AND METHOD FOR TESTING A SIMULATION OF A DEVICE AGAINST ONE OR MORE VIOLATION RULES

(75) Inventors: Mehul Shroff, Austin, TX (US); Peter Abramowitz, Austin, TX (US); Xavier Hours, Tournefeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 28 days.

This patent is subject to a terminal disclaimer.

(21) Appl. No.: 14/398,885

(22) PCT Filed: Sep. 13, 2012

(86) PCT No.: PCT/IB2012/002020
§ 371 (c)(1),
(2), (4) Date: Nov. 4, 2014

(87) PCT Pub. No.: WO2013/179081
PCT Pub. Date: Dec. 5, 2013

(65) Prior Publication Data
US 2015/0143308 A1    May 21, 2015

(30) Foreign Application Priority Data
May 31, 2012  (WO) ............... PCT/IB2012/001195

(51) Int. Cl.
*G06F 17/50* (2006.01)
*G06F 11/26* (2006.01)

(52) U.S. Cl.
CPC ......... *G06F 17/5009* (2013.01); *G06F 11/261* (2013.01); *G06F 17/5022* (2013.01); *G06F 17/5045* (2013.01); *G06F 17/5081* (2013.01)

(58) Field of Classification Search
CPC ................. G06F 17/5009; G06F 17/5045
USPC .................. 716/106, 107, 111, 136
See application file for complete search history.

(56) References Cited

U.S. PATENT DOCUMENTS 6,588,002 B1  7/2003  Lampaert et al.
7,213,218 B2  5/2007  Miura et al.
(Continued)

FOREIGN PATENT DOCUMENTS

WO   2013124703 A1   8/2013
WO   2013179076 A1   12/2013

OTHER PUBLICATIONS

International Search Report and Written Opinion correlating to PCT/IB2012/002020 dated Feb. 21, 2013.
(Continued)

*Primary Examiner* — Sun Lin

(57) ABSTRACT

A simulation system for testing a simulation of a device against one or more violation rules is described. The simulation system comprises a device simulator for executing the simulation of the device using a device design, a device model and a simulation scenario; and one or more violation monitor for each violation rule. At least one of the violation monitors comprises a violation information detector and a threshold controller. The violation information detector is arranged to detect one or more violations of the respective violation rule of the one or more violation rules during the executing the simulation of the device and, for each violation, determine information representing the respective violation, wherein the detecting the one or more violations comprises comparing a simulated parameter against a threshold. The threshold controller is arranged to determine the threshold for the respective violation rule of the one or more violation rules in dependence on a temporal characteristic of a violation associated with the respective violation rule. A method of testing a simulation of a device against one or more violation rules is also described.

20 Claims, 10 Drawing Sheets

(56) References Cited

U.S. PATENT DOCUMENTS

| | | | |
|---|---|---|---|
| 7,689,948 B1 | 3/2010 | White et al. | |
| 8,042,015 B2 | 10/2011 | Choi | |
| 8,069,130 B2 | 11/2011 | Balog | |
| 2005/0278663 A1 | 12/2005 | Kemerer et al. | |
| 2006/0125509 A1 | 6/2006 | Dorough et al. | |
| 2008/0091977 A1 | 4/2008 | Miguelanez et al. | |
| 2008/0163134 A1 | 7/2008 | Nequist et al. | |
| 2014/0380258 A1* | 12/2014 | Hours et al. | G06F 17/5081 716/112 |
| 2015/0121325 A1* | 4/2015 | Hours et al. | G06F 11/261 716/107 |

OTHER PUBLICATIONS

Sobe, Udo et al: "Verication of Safe Operating Area (SOA) Constraints in Analog Circuits", pp. 1-6.
Liu Yan et al: "A Simulation-Based Strategy used in Electrical Design for Reliability" Quality of Electronic Design, 2009. ISQED 2009. Quality Electronic Design, San Jose, CA, Mar. 16-18, 2009, pp. 208-212.
Rosch, Claudia et al: "Advancements in Reliability Simulation", CDNLive! EMEA May 3-5, 2011, Munich, Germany, pp. 1-30.
Jiang, Wei-Si: "An Effective EM/IR-drop Flow with UltraSim and VAVO/VAEO", National Semiconductor Corporation, CDNLive Silicon Valley 2007, pp. 1-13.
Ese Mos-Ak Rome, "Compact Modeling for PV and Aging Effects", Correlated PV and Aging corner models, AustriaMicrosystems, pp. 1-32.
Liu, Zhihong et al: "Design Tools for Reliability Analysis", DAC 2006, Jul. 24-28, 2006, San Francisco, California, USA, pp. 182-187.
Symko, Aaron: "Detecting and Managing Device Reliability in Block-level and Chip-level Simulations", LSI Corporation, Session#9.14, Presented at Cadence Designer Network, Silicon Valley, 2007, pp. 1-18.
Pompl, T. et al: "Practical Aspects of Reliability Analysis for IC Designs", DAC 2006, Jul. 24-28, 2006, San Francisco, California, USA, pp. 193-198.
Cadence, "Reliability Simulation in Integrated Circuit Design", White Paper, San Jose, CA, 2003, pp. 1-11.
Sobe, Udo et al: "Robust Analog Design for Automotive Applications by Design Centering With Safe Operating Areas", IEEE Transactions on Semiconductor Manufacturing, vol. 22, No. 2, May 2009, pp. 217-224.

\* cited by examiner

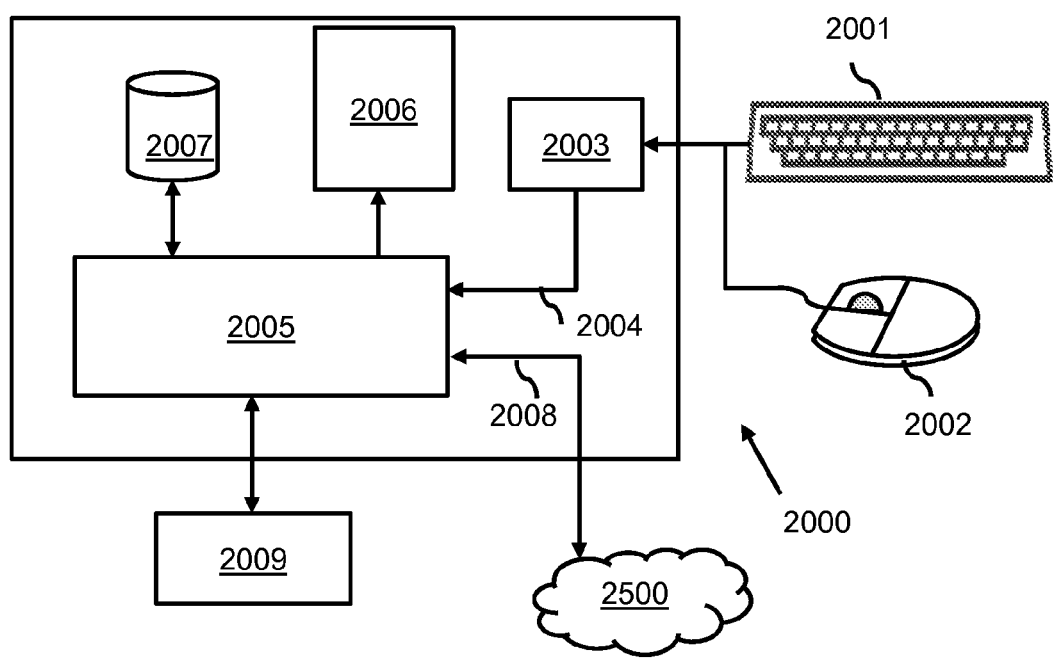
Fig. 12
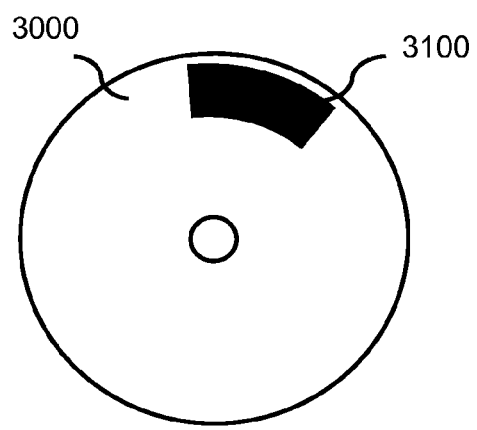 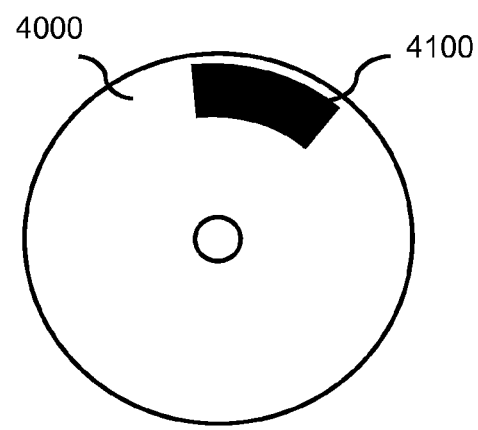
Fig. 13 Fig. 14

SIMULATION SYSTEM AND METHOD FOR TESTING A SIMULATION OF A DEVICE AGAINST ONE OR MORE VIOLATION RULES

FIELD OF THE INVENTION

This invention relates to a simulation system, a method and a computer program product for testing a simulation of a device against one or more violation rules.

BACKGROUND OF THE INVENTION

During the design process of a new electronic device, such as a new semiconductor device, a designer usually performs a simulation of the real-time performance of the device. Such simulations may, for example, be performed pre- or post-layout of the semiconductor device. During the simulation, the performance of the designed device is tested against one or more of test scenarios by reporting reliability warnings and errors during quasi-stationary (DC) or transient simulations. Such warnings and errors may, for example, be issued by tools for detecting safe operating area (SOA) warnings and errors, errors due to electromigration (EM), errors due to electrostatic discharge (ESD), etc. The reported warnings and errors may be written into a log file which can be checked by the designer by inspection of all entries in the log file. In inspecting the log file, the designer evaluates all reported warnings and errors, uses a statistical analysis of the reported errors and warnings, and/or uses some graphical representation indicating the positions of errors and warnings on the device design. However, when designers find such reliability warnings during pre- or post-layout simulation, it may be difficult or even impossible to assess how critical the warnings and errors are, and where to focus attention in adapting the design to overcome the violations. Often, there are too many warnings and errors produced by reliability checks, making it difficult for the designer to review and address all warnings and errors and having a risk that the designer overlooks a critical one. Further, warnings and errors may be due to non-critical transients or may have been introduced as a simulation artifact by the simulator and hence may not be relevant for the actual device, while still requiring attention from the designer.

SUMMARY OF THE INVENTION

The present invention provides a simulation system and a method for testing a simulation of a device against one or more violation rules, and a computer program product and a violation monitor library component as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 12 schematically shows an exemplary user interaction system;

FIG. 13 shows a computer readable medium comprising a computer program product; and FIG. 14 shows another computer readable medium comprising another computer program product.

DETAILED DESCRIPTION OF THE PREFERRED EMBODIMENTS

Figure 1:
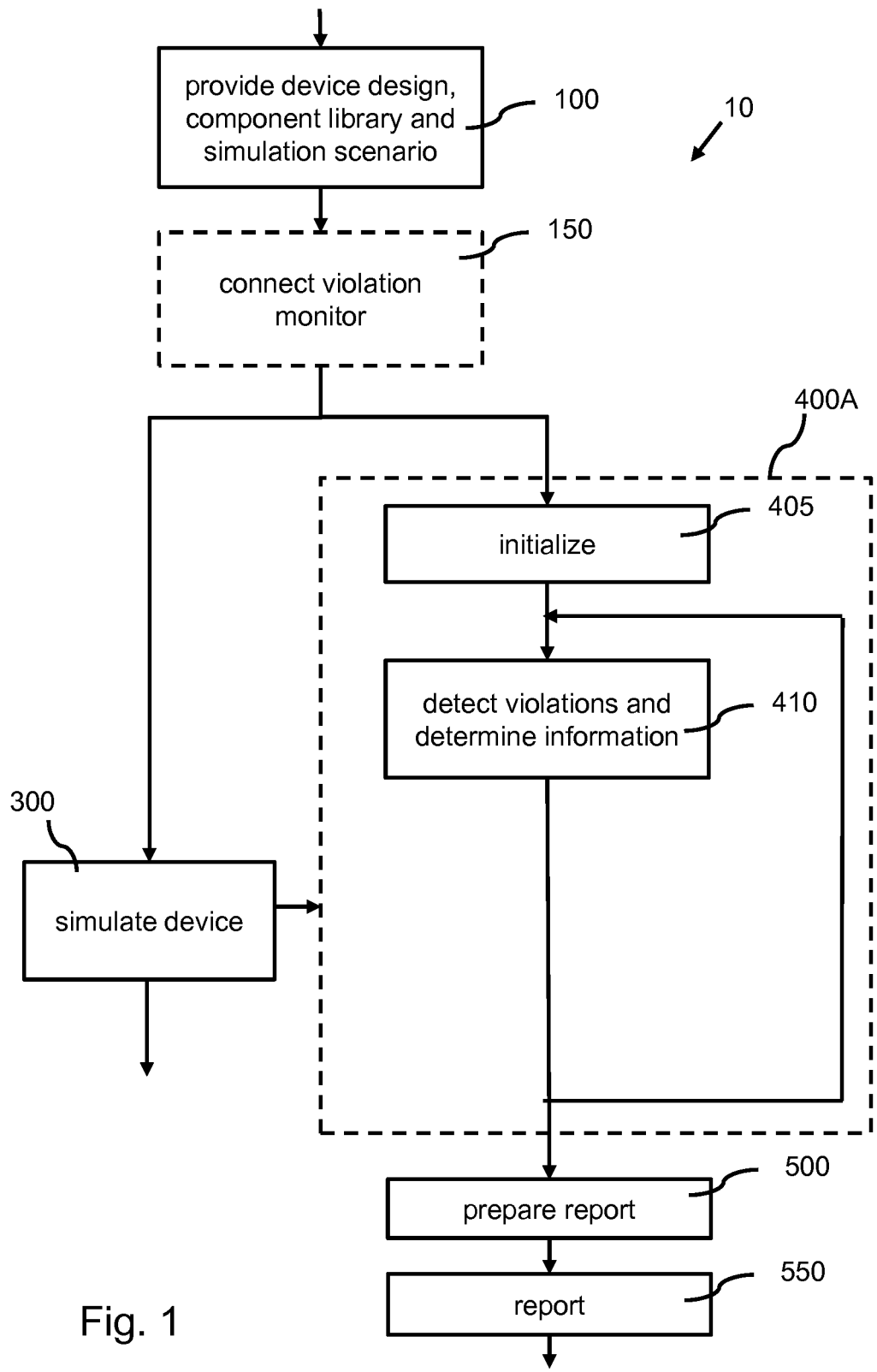
FIG. 1 schematically shows an example of an embodiment of a method.
Figure 2:
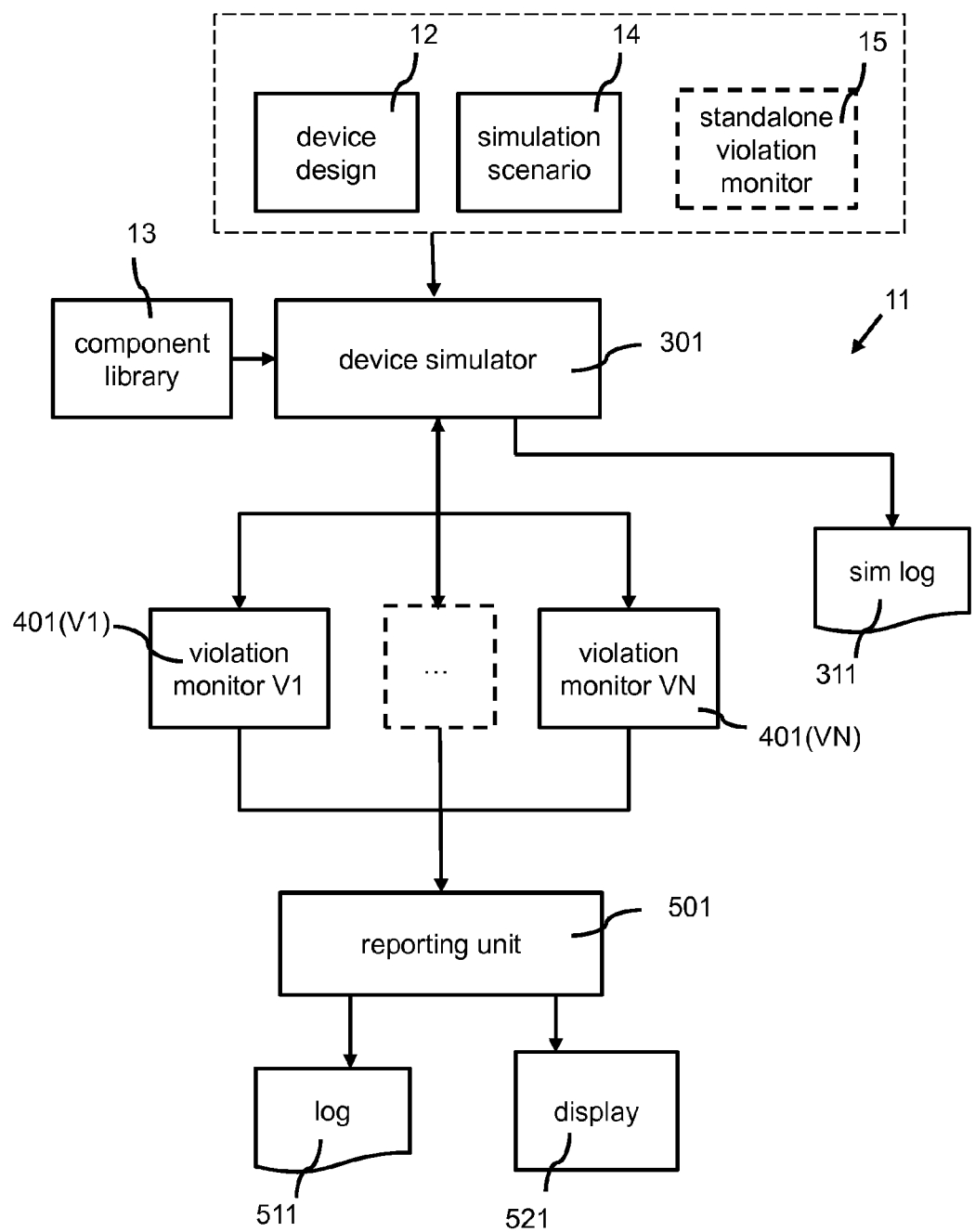
FIG. 2 schematically shows an example of an embodiment of a system.
Figure 3:
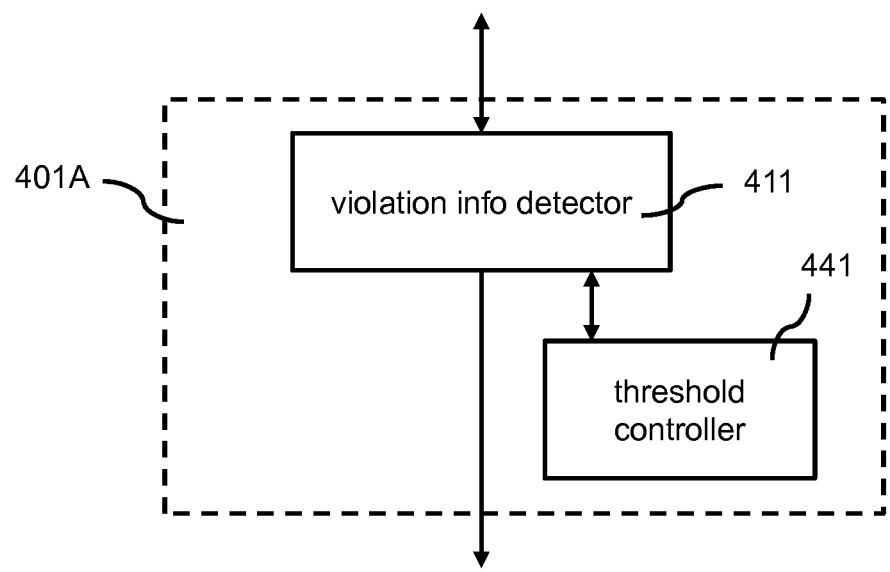
FIG. 3 schematically shows an example of an embodiment of a violation monitor.

FIG. 1 schematically shows an example of an embodiment of a method 10 of testing a simulation of a device against one or more violation rules. FIG. 2 schematically shows an example of an embodiment of a system 11 for testing a simulation of a device against one or more violation rules Vi. The system 11 of FIG. 2 may be arranged for executing the method 10 of FIG. 1. The simulation system 11 comprises a device simulator 301 for executing the simulation of the device using a device design 12, a component library 13 comprising one or more device component models, and a simulation scenario 14. The device design 12 may represent a design of the device in terms of at least one or more device components. The device component models in the component library 13 may represent electrical and/or thermal models of the device component. The simulation system 11 is arranged to build a device model from the device design 12 and the associated one or more device component models from the component library 13 at the start of the simulation, and uses the device model in the simulation. The device simulator 301 is thus arranged to execute the simulation of the device using the device design 12, the component library 13, and the simulation scenario 14. The device simulator 301 is arranged to write simulation results to a simulation log file 311. The simulation is, in this example, an analogue device simulation, where an electrical state of a semiconductor device is simulated using the device design 12 representing a layout of the device components of the design of the semiconductor device, the simulation scenario 14 representing test stimuli and the device model built of device model components in component library 13 describing the behaviour of the device components. The simulation hereto simulates voltages and currents at nodes of the device design and determines voltage levels and current levels during the execution of the simulation. In further examples the simulation may also simulate current densities, rise and/or fall times of signals, temperature levels, occurrences of certain states, and/or other suitable parameters. The simulation system 11 further comprises a plurality of violation monitors 401, one for each violation rule. Each violation monitor 401 is arranged to detect and score violations of one of the violation rules. FIG. 2 shows a simulation system 11 having a plurality violation monitors, indicated as 401(V1), . . . , 401(VN). FIG. 3 shows an example of a first embodiment of a violation monitor, indicated as 401A, in detail. One or more violation monitors of the plurality of violation monitors 401(V1), . . . , 401(VN) may be according to such first embodiment 401A. In the following, reference may be made to a plurality of violation rules Vi=V1, V2, . . . , VN, further referred to as Vi, and respective violation monitors 401(V1), 401(V2), . . . , further referred to as 401(Vi). In the following, components associated with a violation rule Vi may be indicated with Vi in between brackets behind the name of the components. In this and other figures, the indication of Vi in between brackets may be suppressed so as not to obscure the figures with such indications. A violation rule Vi may relate to a violation of a threshold at a node in the device. A violation rule Vi may relate to a violation by a signal level of an electrical signal of a threshold at a node in the device, such as a voltage level exceeding a voltage threshold level or a current level exceeding a current threshold level. In the following non-limiting example, a first violation rule V1 relates to a first violation type and a second violation rule V2 relates to a second violation type. In the example, the first violation rule V1 relates to a violation of a current level threshold of an analogue current at a node of the device and a second violation rule V2 relates to a violation of a voltage level threshold of an analogue voltage at another node of the device. Current levels and voltage levels at certain nodes may, for example, relate to violations which impact reliability, such as electromigration issues, which may be identified with a large current density in excess of an allowed current density that may be a function of a width and/or length of an interconnect, and/or of operating or simulation temperature; electrostatic discharge (ESD) risks, hot carrier injection (HCI), time dependent dielectric breakdown (TDDB), negative bias temperature instability (NBTI) or positive bias temperature instability (PBTI), which may be identifiable with currents into, for example, the device substrate and/or voltages on certain nodes. HCI, TDDB, NBTI, and PBTI violations may alternatively be identified from, for example, threshold voltage shift of the device or a device component. HCI, TDDB, NBTI, and PBTI voltage and/or current limits may be a function of the operating or simulation voltage, temperature, and device geometry and type.

Each violation monitor 401(Vi) comprises a violation information detector 411(Vi) for detecting one or more violations of the respective violation rule Vi during the executing of the simulation and for, for each violation, determining information representing the respective violation. In this example, the information representing the respective violation may comprise one or more of a group comprising an amplitude of the respective violation, such as a peak level of the respective violation, a duration of the respective violation and a relaxation duration of the respective violation. Herein, the term "relaxation duration" relates to the time between the start of the violation and the end of the preceding violation of the respective violation rule.

FIG. 3 shows an example of a violation monitor 401(Vi) according to first embodiment 401A. The violation monitor comprises a threshold controller 441 for determining the threshold for the violation rule Vi in dependence on a temporal characteristic of the associated violation. Hereto, the threshold controller 441 may be arranged to determine the temporal characteristic of the associated violation and establish the threshold in dependence on the temporal characteristic as determined.

The temporal characteristic may, for example, relate to a duration of a violation of the violation type associated with violation rule Vi and the threshold controller 441 may establish a threshold in dependence on the duration of the violation. Such a threshold may be referred to as an adjustable threshold, or as a dynamical threshold. The threshold may, for example, be lower for long durations than for shorter durations. Hereby, signals exceeding potentially dangerous levels may be considered acceptable if the signal increase only occurs during a very short period of time and is not too severe, so that the increase is not considered a violation of the violation rule, whereas signals of very high level and/or of long duration will be considered a violation. The threshold controller 441 may thus determine the duration of a violation and establish the threshold in dependence on the duration. As an example, an exemplary transistor may be operable at a nominal voltage of 2.5V. If a voltage at any of its nodes exceeds a first threshold of 2.75 V for a duration longer than 2 ns, a violation is detected. However, if the voltage increase has a shorter duration, a violation is detected if the voltage at any of its nodes exceeds a second threshold of 3.0 V for less than 2 ns.

The temporal characteristic may alternatively relate to a duty cycle of a violation of the violation type associated with violation rule Vi and the threshold controller 441 may establish a threshold in dependence on the duty cycle of the violation. For example, a low duty cycle increase of a signal to a potentially dangerous level may be tolerated at a higher threshold than a high duty cycle increase. The duty cycle $\delta$ may, for example, be determined from a duration D of a violation and a relaxation duration R of a relaxation before or after the violation as $\delta=D/(D+R)$. If the violation has a periodic character, the duty cycle may relate to the duty cycle of the periodic violation. The threshold controller 441 may thus determine the duty cycle of a violation or of a sequence of violations, and establish the threshold in dependence on the duty cycle. As an example, an exemplary transistor may be operable at a nominal voltage of 2.5V. If a voltage at any of its nodes exceeds a first threshold of 2.75 V for a duty cycle longer than 10%, a violation is detected. However, if the voltage increase has a shorter duty cycle, a violation is detected if the voltage at any of its nodes exceeds a second threshold of 3.0 V with a duty cycle of less than 10%.

The temporal characteristic may alternatively relate to an accumulated duration of one or more violations of the violation type associated with violation rule Vi and the threshold controller 441 may establish a threshold in dependence on the accumulated duration. For example, the threshold may be lowered once a predetermined accumulated duration is reached, whereby further increases beyond potentially dangerous levels are considered to be violations of the associated violation rule at smaller signal increases. The threshold controller 441 may thus determine the accumulated duration of one or more violations and establish the threshold in dependence on the accumulated duration.

For executing the method shown in FIG. 3, the simulation system 11 in FIG. 2 further comprises a reporting unit 501 for preparing a report of information representing the respective violation of the one or more violation rules and for reporting the report to a user. The reporting unit may hereto obtain information representing the respective violation(s) from all violation monitors 401(Vi) and, for example, sort or filter them to report, for example, only the most critical violations. The sorting may relate to putting the rule scores in order of criticality. The filtering may relate to only reporting information when a certain condition is met, for example, when the amplitude of the violation exceeds a certain further threshold, with the certain further threshold, for example, being controlled by the designer.

The reporting unit 501 may report real-time while running the simulation, and/or at the end of the simulation. The reporting unit 501 may report (at least part of) the information representing the detected violations. This may allow the designer to do a detailed inspection of individual violations of, for example, the highest-amplitude or the longest-duration violations and to adapt the design of the semiconductor device to make it robust against such violations.

The reporting unit 501 is arranged to write the (at least part of) the information representing the detected violations to a log file 511. Information about the violations may thus be gathered in the log file so that a user, for example, the designer, can inspect them offline. Subsequent log processing may sort violations, for example, in order of importance of the violating event, and/or filter violations, for example, with filtering dependent on the stage in the design and simulation process.

Due to the use of a threshold determined in dependence on a temporal characteristic of the associated violation, only violations of a certain severity are reported. A designer is thus, when inspecting the report, not distracted by violations having such temporal characteristic that the violation only has minor impact on, for example, device performance and/or reliability. Further, the number of violations that are reported may be reduced significantly compared to the situation where a fixed threshold is used, as a fixed threshold detection usually results in a significantly large number of, for example, very short-duration violations of the fixed threshold. The designer may thus relatively easily identify which violations to pay attention to as highest priority violation(s), while the designer is relieved from the burden of investigating many individual warnings or errors of all kinds of violations of low severity due to their temporal characteristic from the log file. Once the designer has fixed the highest priority violation, he may find that one or more other violations of other violation types have also been fixed. If not, he may continue to fix the next highest priority violation set.

The violation monitor 401 may be part of the device simulator unit 301. Alternatively, the violation monitor and the device simulator unit may be separate units.

The detection of violations may be built inside the device component model or as a standalone component. The reporting may occur during DC or transient simulation.

FIG. 1 schematically shows a method 10 of testing a simulation of a device against one or more violation rules that may be performed by the simulation system 11. The method comprises providing 100 a device design, a component library, and a simulation scenario; executing 300 a simulation of the device using the device design, the component library, and the simulation scenario; detecting 400A one or more violations of the respective violation rule Vi during the executing of the simulation; preparing 500 a report of violation information associated with the one or more violation rules and reporting 550 the report. The report is reported real-time, i.e., during the execution of the simulation, allowing a user to view 550 the report during the simulation. In an alternate embodiment, the report can be generated in a post-processing step after the simulation is complete.

The detecting 400A of the one or more violations of the respective violation rule Vi during the executing of the simulation comprises initializing 405 a plurality of violation detectors at the start of the simulation and detecting 410, for each violation rule of the plurality of violation rules, one or more violations of the respective violation rule during the executing of the simulation and determining information representing the violation of the respective violation rule. The detecting 410 comprises comparing a signal level against a threshold determined in dependence on a temporal characteristic of the associated violation. The detecting 410 comprises determining the temporal characteristic of the associated violation, establishing the threshold in dependence on the temporal characteristic as determined, and using the threshold in detecting the associated violation.

The device model comprises the violation monitor(s) for one or more violation rules in one example. The device design comprises the violation monitor(s) for one or more violation rules in another example. In another example, the method comprises, prior to executing the simulation 300 of the device, connecting 150 a stand-alone violation monitor 15 to the device design or to the device model. The stand-alone violation monitor 15 is arranged to, for one violation rule, perform the detecting 410 of the violations of the respective violation rule during the executing of the simulation and the determining of the information representing the violation of the respective violation rule.

Figure 4:
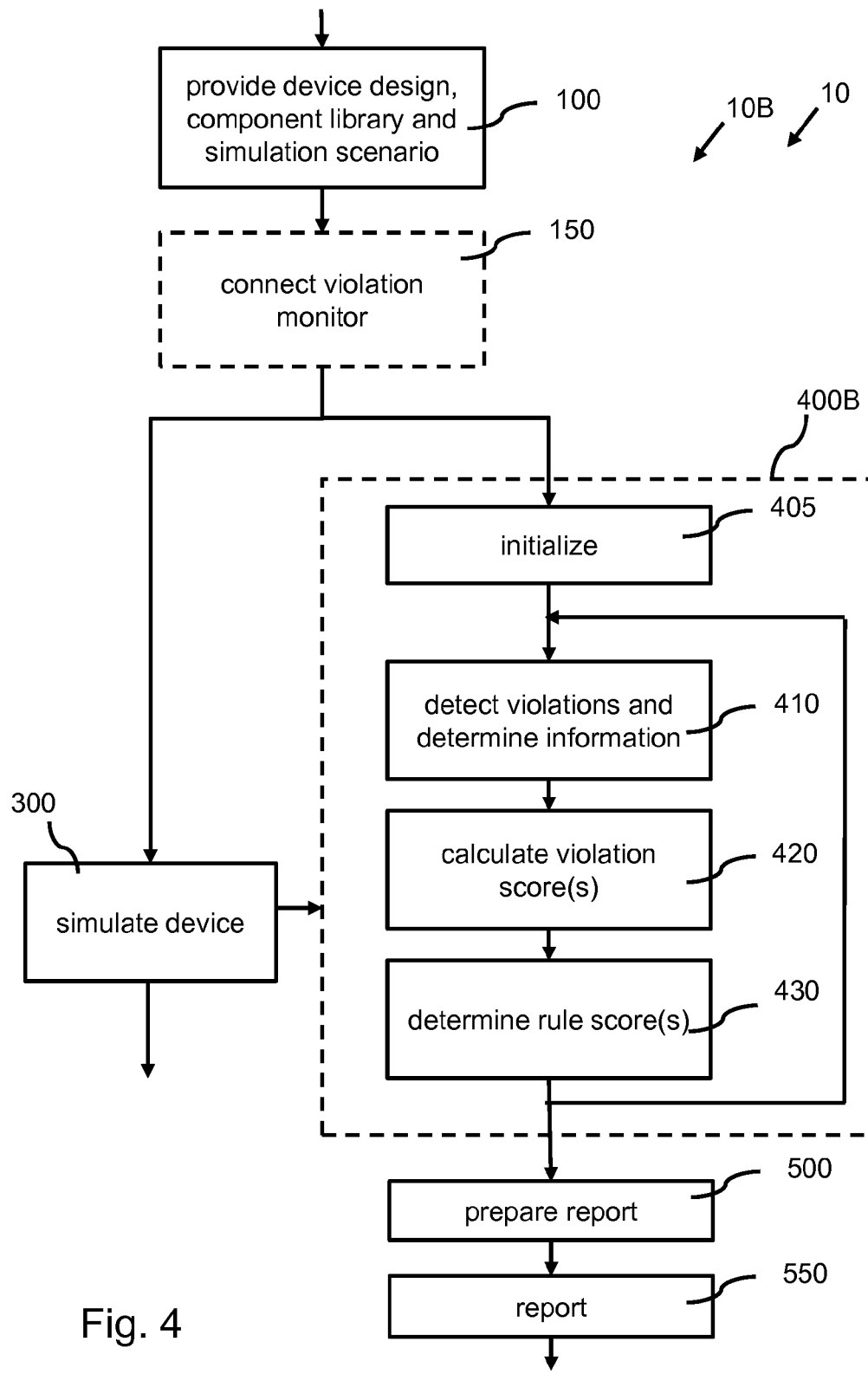
FIG. 4 schematically shows an example of another embodiment of a method.
Figure 5:
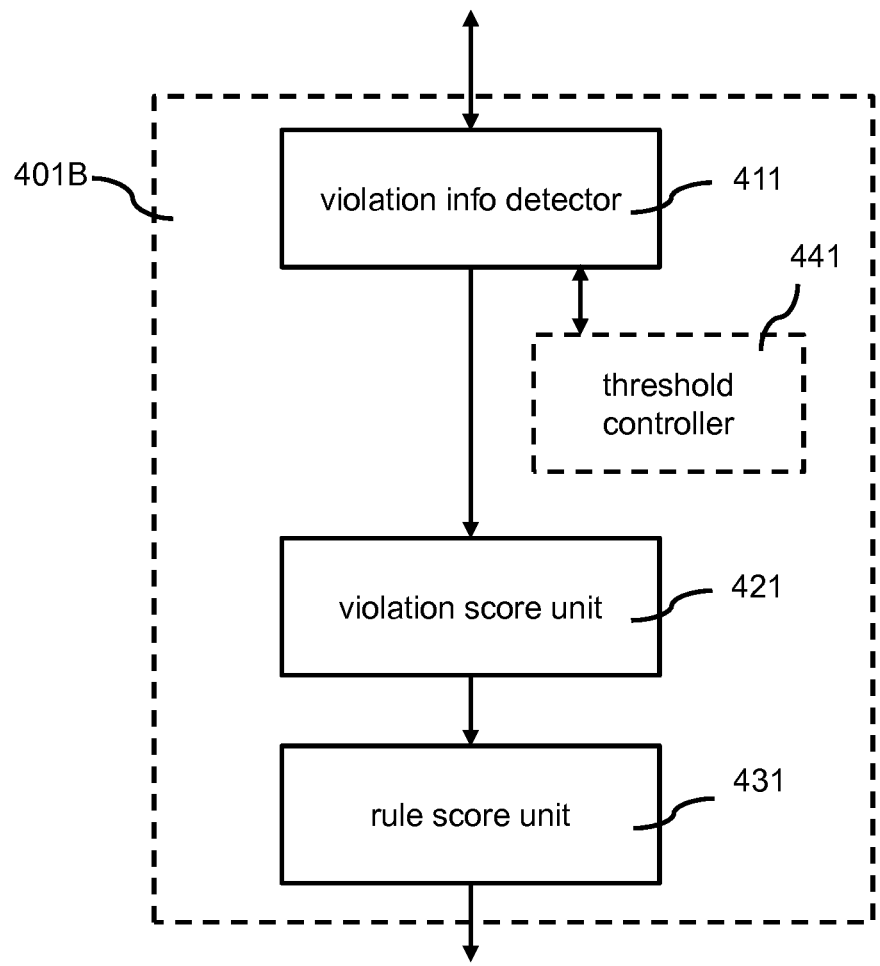
FIG. 5 schematically shows an example of another embodiment of a violation monitor.

FIG. 4 schematically shows an example of another embodiment 10B of a method 10 of testing a simulation of a device against one or more violation rules. The system 11 of FIG. 2 may be arranged for executing the method 10B of FIG. 4. Components shown in FIG. 4 that may be substantially the same as, or that may be alternatives to or further embodiments of corresponding components shown of FIG. 1 are indicated with corresponding numerals. The simulation system 11 comprises a device simulator 301 for executing the simulation of the device using a device design 12, a component library 13 comprising one or more device component models, and a simulation scenario 14. The device design 12 may represent a design of the device in terms of at least one or more device components. The device component models in the component library may represent an electrical and/or thermal model of the device component. The simulation system 11 is arranged to build a device model from the device design 12 and the associated one or more device component models from the component library 13 at the start of the simulation, and uses the device model in the simulation. The device simulator 301 is thus arranged to execute the simulation of the device using the device design 12, the component library 13, and the simulation scenario 14. The device simulator 301 is arranged to write simulation results to a simulation log file 311. The simulation is, in this example, an analogue device simulation, where an electrical state of a semiconductor device is simulated using the device design 12 representing a layout of the device components of the design of the semiconductor device, the simulation scenario 14 representing test stimuli and the device model built of device model components in component library 13 describing the behaviour of the device components. The simulation hereto simulates voltages and currents at nodes of the device design and determines voltage levels and current levels during the execution of the simulation. In further examples the simulation may also simulate current densities, rise and/or fall times of signals, temperature levels, occurrences of certain states, and/or other suitable parameters. The simulation system 11 further comprises a plurality of violation monitors 401, one for each violation rule. Each violation monitor 401 is arranged to detect violations of one of the violation rules and may further be arranged to score violations of one of the violation rules. FIG. 2 shows a simulation system 11 having a plurality violation monitors, indicated as 401(V1), . . . , 401(VN). One or more violation monitors may be according to embodiments as described above with reference to FIG. 3 and indicated with 401A therein. FIG. 5 shows an example of a second embodiment of a violation monitor, indicated as 401B, in detail. One or more violation monitors of the plurality of violation monitors 401(V1), . . . , 401(VN) may be according to embodiments 401B as described below with reference to FIG. 5. Components shown in FIG. 5 that may be substantially the same as or that may be alternative or further embodiments of corresponding components shown of FIG. 3 are indicated with corresponding numerals. In the following, reference may be made to a plurality of violation rules Vi=V1, V2, . . . , VN, further referred to as Vi, and respective violation monitors 401(V1), 401(V2), . . . , further referred to as 401(Vi). In the following, components associated with a violation rule Vi may be indicated with Vi in between brackets behind the name of the components. As above, the indication of Vi in between brackets may be suppressed so as not to obscure the figures with such indications. In the following non-limiting example, a first violation rule V1 relates to a first violation type and a second violation rule V2 relates to a second violation type. In the example, the first violation rule V1 relates to a violation of a current level threshold of an analogue current at a node of the device and a second violation rule V2 relates to a violation of a voltage level threshold of an analogue voltage at another node of the device. Current levels and voltage levels at certain nodes may, for example, relate to violations which impact reliability, such as electromigration issues, which may be identified with a large current density in excess of an allowed current density that may be a function of a width and/or length of an interconnect, and/or of operating or simulation temperature; electrostatic discharge (ESD) risks, hot carrier injection (HCI), time dependent dielectric breakdown (TDDB), negative bias temperature instability (NBTI) or positive bias temperature instability (PBTI), which may be identifiable with currents into, for example, the device substrate and/or voltages on certain nodes. HCI, TDDB, NBTI, and PBTI violations may alternatively be identified from, for example, threshold voltage shift of the device or a device component. HCI, TDDB, NBTI, and PBTI voltage and/or current limits may be a function of the operating or simulation voltage, temperature, and device geometry and type.

Each violation monitor 401(Vi) comprises a violation information detector 411(Vi) for detecting one or more violations of the respective violation rule Vi during the executing of the simulation and for, for each violation, determining information representing the respective violation. In this example, the information representing the respective violation may comprise a peak level of the respective violation, a duration of the respective violation and a relaxation duration of the respective violation. Herein, the term "relaxation duration" relates to the time between the start of the violation and the end of the preceding violation of the respective violation rule.

FIG. 5 shows an example of a violation monitor 401(Vi) according to second embodiment 401B. As shown in FIG. 5, the violation monitor may further comprise a violation score unit 421(Vi) for calculating, for each violation of the respective violation rule, a violation score in dependence on the information representing the violation and on a violation rule-specific scheme. The violation rule-specific scheme may, for example, take into account the peak level, the duration and the relaxation duration of the violation. The violation rule-specific scheme may further comprise a violation rule-specific weight and/or a device-specific weight. Hereby, the violation scores of different violation types may be scaled to a level of severity. Such scaling may be referred to as normalizing, and the violation scores thus obtained may be referred to as normalized scores. This may facilitate relatively straightforward comparison and/or ranking of violations of different violation types, as the designer can directly use the normalized scores. The information used for calculating the violation score of a respective violation rule may comprise at least a first violation parameter of a violation parameter group comprising a violation start time, a violation stop time, a violation duration, a violation count, a violation peak amplitude and a violation relaxation duration relative to a preceding violation, and the violation score is calculated using a violation rule-specific function of at least the first violation parameter. The first violation parameters may for example be tested against a respective threshold value, for example, the first violation rule relating to the current at a certain node exceeding a current threshold level. The respective threshold for the violation rule Vi may be a fixed threshold, or may be a threshold for the violation rule Vi in dependence on a temporal characteristic of the associated violation, similar to the dynamical threshold described above. Hereto, one or more of the violation monitors 401(Vi) may, as shown in FIG. 5, comprise a threshold controller 441 for determining the threshold for the violation rule Vi in dependence on a temporal characteristic of the associated violation. Hereto, the threshold controller 441 may be arranged to determine the temporal characteristic of the associated violation and establish the threshold in dependence on the temporal characteristic as determined.

The information used for calculating the violation score of a respective violation rule may further comprise at least a second violation parameter. An exemplary violation rule-specific scheme may, for example, be described as follows. Upon the detection of a next violation n+1 of the i-th violation rule $V_i$, the corresponding violation score unit 421($V_i$) calculates a violation score $\Delta Sc$ from the violation information using the violation rule-specific scheme defined by the following formula:

$$\Delta Sc(V_i(n+1)) = \frac{(P(V_i(n+1)) - Thr(V_i))}{Thr(V_i)} * No(V_i) * f(D(V_i(n+1)),$$
$$R(V_i(n+1)), V_i) * Vt(DT, V_i)$$

with:

$\Delta Sc(V_i(n+1))$: violation score calculated for $(n+1)^{th}$ violation of violation rule $V_i$, $P(V_i(n+1))$: peak value of $V_i$, $(n+1)^{th}$ violation of violation rule $V_i$, $Thr(V_i)$: threshold for violation of violation rule $V_i$, $No(V_i)$: violation type-specific weight for type of violation rule $V_i$ (relative weight of this violation type against other violation types), $Vt(DT, V_i)$: device class-specific weight for this violation type for device component DT (correction factor to $No(V_i)$ for this device component class);

$D(V_i(n+1))$: duration of $V_i$ $(n+1)^{th}$ violation of violation rule $V_i$, R($V_i$(n+1)): relaxation duration between $n^{th}$ and $(n+1)^{th}$ violation of violation rule $V_i$,
and wherein function $f(.)$ is a function defining a raw score as a function of the duration, relaxation duration and violation type. The function $f(.)$ may, for example, be linear with the duration of the violation and inversely proportional with the relaxation duration for one type of violation, whereas it is only dependent on the duration and independent of relaxation duration for another type of violation. The function $f(.)$ may, as another example, be proportional to the duration if the violation and independent of the relaxation duration for another type of violation.

The information may thus comprise at least a first violation parameter and a second violation parameter of a violation parameter group comprising a violation start time, a violation stop time, a violation duration, a violation count, a violation peak amplitude and a violation relaxation duration relative to a preceding violation, and each violation score is calculated using a violation rule-specific function of at least the first violation parameter and the second violation parameter. At least one of the first and second violation parameters are tested against a respective threshold value, for example, the first violation rule may relate to the current at a certain node exceeding a current threshold level, an associated first and second violation parameter may be the peak amplitude of the current during the violation and the duration of the violation respectively, and the violation score may be calculated using the peak amplitude of the current during the violation, the current threshold level, and the duration, wherein the calculation comprises calculating a difference between the peak amplitude and the current threshold level, and multiplying the difference with the duration.

Although violation scores are calculated using a violation rule-specific scheme, different violation rule-specific schemes may use a standardized formula, for example, the formula for $\Delta Sc$ shown above, wherein only the coefficients are violation rule-specific (e.g., Thr($V_i$), No($V_i$), $V_t$(DT, $V_i$))). The coefficients may, for example, be defined by a user, such as a designer, to facilitate scoring according to user needs.

Each violation monitor 401(Vi) further comprises a rule score unit 431(Vi) for determining, for the respective violation rule, a rule score from the violation scores of the one or more violations during the simulation.

In this example, each rule score unit 431($V_i$) calculates a respective rule score Sc(Vi) by adding the violation score to the previous rule score:

$$Sc(V_i(n+1))=Sc(V_i(n))+\Delta Sc(V_i(n+1)))$$

where the previous rule score is the rule score as determined until the detection of the (n+1)th violation of the violation rule Vi.

Thus, each violation rule Vi may be associated with a violation of a different violation type of a plurality of violation types and the calculating of the violation score using a weighting factor No($V_i$) dependent on the violation type. The violation type-specific weight No($V_i$) may allow to normalize errors of one violation type relative to errors of another violation type, whereby violations of different types may easily be compared, ranked, and/or filtered.

Each violation rule Vi may be associated with a device class-specific weight Vt(DT, $V_i$). The device class-specific weight may for example be selected according to the device design by the simulation system or method, or by a user. Using device class-specific weights Vt(DT, $V_i$) may be seen as a correction to the violation type-specific weight No($V_i$), to effectively adjust the violation type-specific weight in dependence on the device class, to accommodate for different levels of criticality of the same violation type for different classes of devices.

For executing the method shown in FIG. 4, the simulation system 11 shown in FIG. 2 further comprises a reporting unit 501 for preparing a report of the rule scores associated with the one or more violation rules and for reporting the report to a user. The reporting unit may hereto obtain the rule scores Vi from all violation monitors 401(Vi) and, for example, sort or filter them to report, for example, only the most critical violations. The sorting may relate to putting the rule scores in order of criticality. The filtering may relate to only reporting rule scores when a certain condition is met, for example, when a rule score exceeds a certain threshold, with the certain threshold, for example, being controlled by the designer.

The reporting unit 501 may report real-time while running the simulation, and/or at the end of the simulation. The reporting unit 501 may further report individual violation scores of the one or more detected violations and/or (at least part of) the information representing the detected violations, as also described with reference to FIG. 1. This may allow the designer to do a detailed inspection of individual violations of, for example, the highest-ranked violation type and to adapt the design of the semiconductor device to make it robust against such violations.

The reporting unit 501 is arranged to write the selection of the rule scores to a log file 511. The rule scores of different type of violations may thus be gathered in the log file so that a user, for example, the designer, can inspect them offline. Subsequent log processing may sort violations by rule score, for example, in order of importance of the violating event, and/or filter violations by rule score, for example, with filtering dependent on the stage in the design and simulation process. The scoring may thus allow the designer to pay attention to the highest priority violation(s), while taking away the burden of investigating many individual warnings or errors of all kinds of violation types from the log file. Once the designer has fixed the highest priority violation, he may find that one or more other violations of other violation types have also been fixed. If not, he may continue to fix the next highest priority violation set.

Hereby, a way is provided for the designer to quantify the risk of not meeting reliability thresholds from a ranking by criticality of run time errors, combining any type of reliability issues (device degradation, line degradation, thermal effects). The violation monitors may comprise a plurality of different tools for checking different types of violations, such as, for example, an ESD checker, a Safe Operating Area checker, a thermal events checker, a stress migration or electromigration checker, a substrate currents checker. These different tools may provide warning and errors to a single reporting unit 501, for obtaining a single violation database with a normalized rule score for each violated rule.

The violation monitor 401 may be part of the device simulator unit 301. Alternatively, the violation monitor and the device simulator unit may be separate units.

The detection and scoring of violations may be built inside the device component model or as a standalone component. The reporting may occur during DC or transient simulation.

FIG. 4 schematically shows an example of another embodiment 10B of method 10 of testing a simulation of a device against one or more violation rules that may be performed as an embodiment of the simulation system 11. Components shown in FIG. 4 that may be substantially the same as or that may be alternative or further embodiments of corresponding components shown of FIG. 1 are indicated with corresponding numerals. The method comprises providing 100 a device design, a component library, and a simulation scenario; executing 300 a simulation of the device using the device design, the component library and the simulation scenario; detecting and scoring 400B one or more violations of the respective violation rule Vi during the executing of the simulation; preparing 500 a report of rule scores associated with the one or more violation rules and reporting 550 the report. The report is reported real-time, i.e., during the execution of the simulation, allowing a user to view 550 the report during the simulation. In an alternate embodiment, the report can be generated in a post-processing step after the simulation is complete.

The detecting and scoring 400B of the one or more violations of the respective violation rule Vi during the executing of the simulation comprises initializing 405 a plurality of rule scores at the start of the simulation; detecting 410, for each violation rule of the plurality of violation rules, one or more violations of the respective violation rule during the executing of the simulation and determining information representing the violation of the respective violation rule; calculating 420, for each violation of each violation rule of the plurality of violation rules, a violation score in dependence on the information representing the violation of the respective violation rule during the executing of the simulation; and determining 430, for each violation rule of the plurality of violation rules, a respective rule score from the violation scores of the one or more violations during the simulation. The detecting 410 comprises detecting at least a first violation parameter and a second violation parameter of a violation parameter group comprising a violation start time, a violation stop time, a violation duration, a violation peak amplitude and a violation relaxation duration relative to a preceding violation, wherein the information comprises at least the first violation parameter and the second violation parameter as detected, and each violation score is calculated using a violation rule-specific function of at least the first violation parameter and the second violation parameter.

The device model comprises the violation monitor(s) for one or more violation rules in one example. The device design comprises the violation monitor(s) for one or more violation rules in another example. In another example, the method comprises, prior to executing the simulation 300 of the device, connecting 150 a stand-alone violation monitor 15 to the device design or to the device model. The stand-alone violation monitor 15 is arranged to, for one violation rule, perform the detecting 410 of the violations of the respective violation rule during the executing of the simulation and the determining of the information representing the violation of the respective violation rule; the calculating 420 of the violation score in dependence on the information for representing the violation of the respective violation rule during the executing of the simulation; and the determining 430 of the rule score from the violation scores during the simulation.

Figure 6:
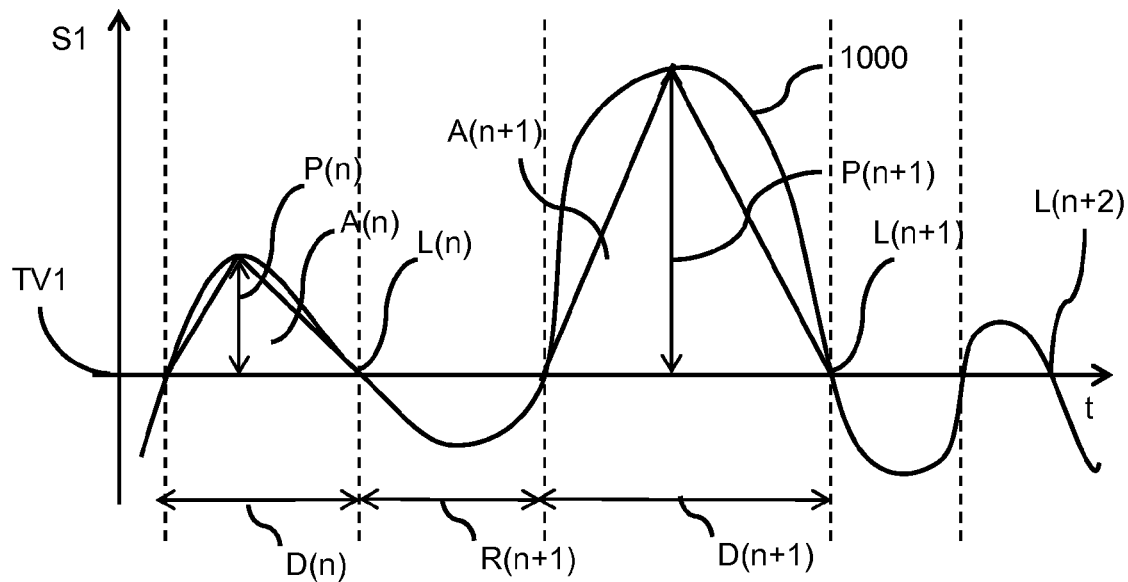
FIG. 6 schematically shows a simplified example of violations.

FIG. 6 schematically shows a simplified example of violations of a first violation rule. In this example, the first violation rule V1 relates to a first violation type corresponding to a violation of a current level threshold TV1 of an analogue current at a node of the device. The reference to V1 in duration $D(.)$, peak level $P(.)$, relaxation duration $R(.)$, and log time $L(.)$ is suppressed in FIG. 6 in order not to obscure the figure. The simulated current level, indicated with its signal amplitude S1 along the vertical axis, is indicated as a function of time, as indicated with t along the horizontal axis, with trace 1000.

FIG. 6 shows an example wherein the simulated current violates the first violation rule 3 times over the shown period of time. A first violation occurs with a duration $D(n)$ with peak level $P(n)$ until time $L(n)$. At time $L(n)$, the violation score of the first violation is calculated from the violation-specific rule associated with the first violation rule, and the rule score of the first violation rule is updated with the violation score and reported. As an example, calculating the violation score $\Delta Sc$, may be done using the formula presented above with $f(.)$ being proportional to the violation duration by using $f(D(V_i(n)), R(V_i(n)), V_i)=0.5*D(n)$, whereby the violation score $\Delta Sc$ corresponds to a triangular approximation of a measure of the area between the curve 1000 and the threshold TV1, as schematically indicated by triangle $T(n)$. A second violation occurs after a relaxation duration $R(n+1)$. The second violation has a duration $D(n+1)$ with peak level $P(n+1)$ until time $L(n+1)$. At time $L(n+1)$, the violation score of the second violation is calculated using triangular approximation via triangle $T(n+1)$, and the rule score of the first violation rule is updated with the violation score and reported. At the end of a subsequent third violation at time $L(n+2)$, the violation score of the third violation is calculated, and the rule score of the first violation rule is updated with the violation score and reported.

Figure 7:
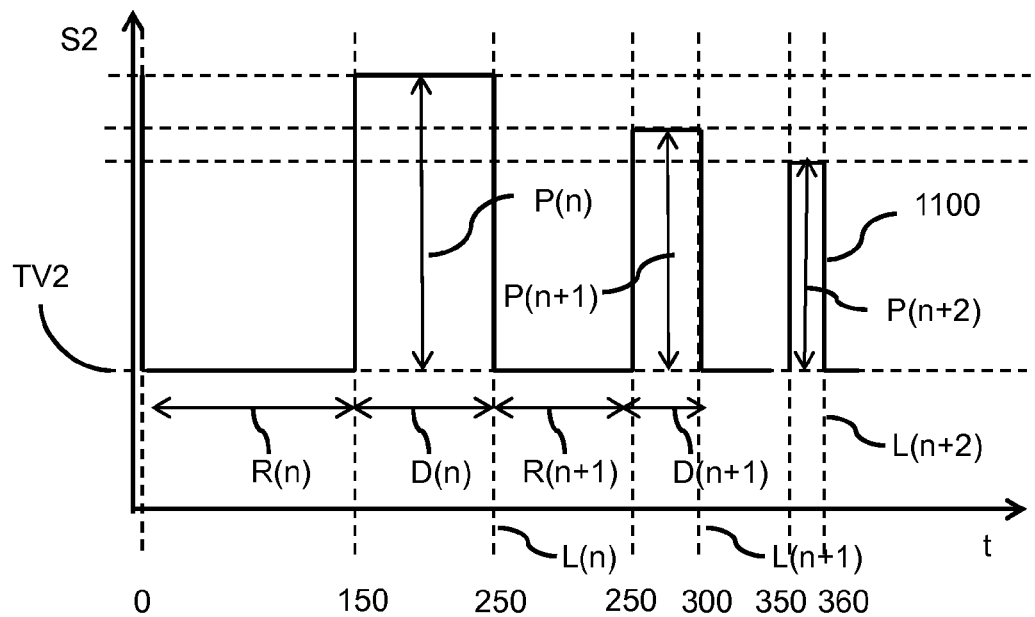
FIG. 7 schematically shows a first further simplified example of violations.

FIG. 7 schematically shows a simplified example of violations of a second violation rule. In this example, the second violation rule V2 relates to a second violation type corresponding to a violation of a voltage level threshold TV2 of a voltage at another node of the device. The simulation starts with a rule score initialized at $Sc(V2)=0$. The voltage corresponds to a drain-source voltage over a low-voltage transistor. The threshold voltage TV2 is 1.35 V. The reference to V2 in duration $D(.)$, peak level $P(.)$, relaxation duration $R(.)$, and log time $L(.)$ is suppressed in FIG. 7 in order not to obscure the figure. The simulated voltage level, indicated with its signal amplitude S2 along the vertical axis, is indicated as a function of time, as indicated with t along the horizontal axis, with trace 1100. FIG. 7 shows an example wherein the simulated voltage violates the second violation rule 3 times over the shown period of time. A first violation occurs from time 150 ns to 250 ns with a duration $D(n)=250-150=100$ ns and peak level $P(n)=1.9$ V, corresponding to a 40% voltage overshoot. At time $L(n)=250$ ns, the violation score of the first violation is calculated from the violation-specific rule associated with the second violation rule as $\Delta Sc(V2(n))=100$ ns×40%=40, and the rule score of the second violation rule is updated with the violation score to $Sc(V2)=0+40=40$ and reported. In this example, the second violation occurs after a relaxation duration $R(n+1)$. The second violation occurs from time 250 ns to 300 ns, i.e., a duration $D(n+1)=50$ ns, with peak level $P(n+1)$ corresponding to a 30% voltage overshoot. At time $L(n+1)$, the violation score of the second violation is calculated as $\Delta Sc(V2(n+1))=50$ ns×30%=15, and the rule score of the first violation rule is updated with the violation score to $Sc(V2)=40+15=55$ and reported. At the end of a subsequent third violation, from time 350 ns to 360 ns, at a peak level $P(n+2)$, corresponding to a 30% voltage overshoot, the violation score of the third violation is calculated as $\Delta Sc(V2(n+2))=10$ ns×30=3, and the rule score of the second violation rule is updated with the violation score to $Sc(V2)=55+3=58$ and reported.

In other embodiments, other methods of computing the score may be used, for example, but not limited to, a count of the violations of each type for each device of interest. Further, the threshold used in detecting a violation of one or more of the violation rules may be a dynamic threshold.

Figure 8A:
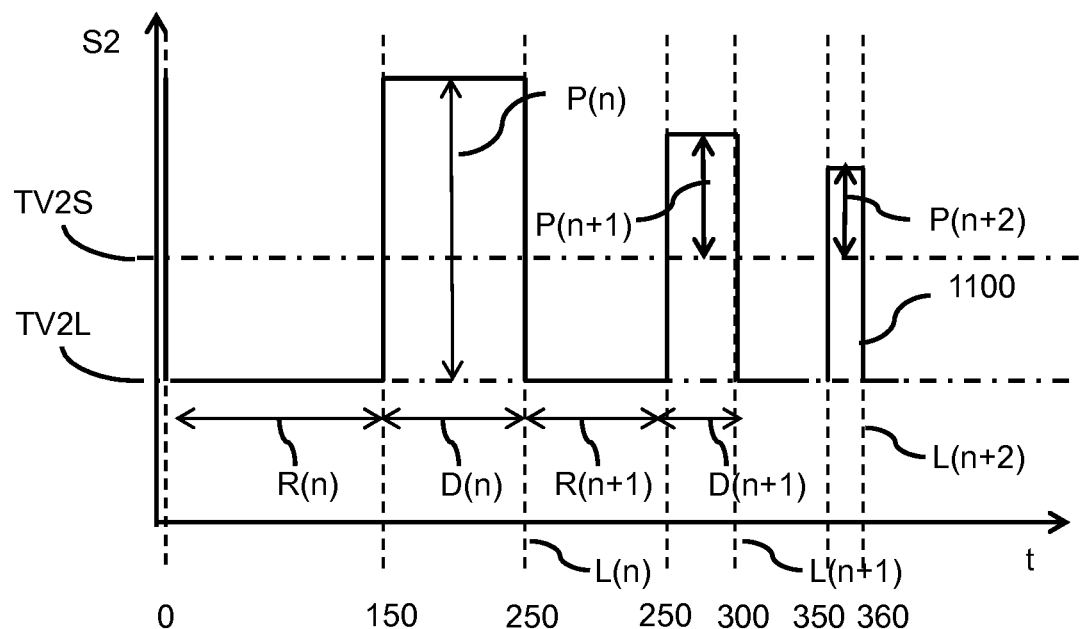
FIG. 8a-FIG. 10 schematically show further simplified examples of violations.

FIG. 8a schematically shows a simplified example of violations of a variant of the second violation rule, wherein in contrast to the fixed threshold TV2 of FIG. 7, the second violation rule uses a dynamic threshold. In this example, the threshold for the violation rule Vi is determined in dependence on a temporal characteristic of the associated violation, and temporal characteristic corresponds to the duration of a violation of the violation type associated with violation rule Vi. In this example, the variant of second violation rule V2 relates to a variant of a second violation type, which corresponds to a violation of a long voltage level threshold TV2L of a voltage at a node where the violation has a duration longer than a predetermined duration and a violation of a short voltage level threshold TV2S of the voltage at the node where the violation has a duration shorter than or equal to the predetermined duration. In this example, the voltage corresponds to a drain-source voltage over a low-voltage transistor, as in FIG. 7. The long threshold voltage TV2L is 1.35 V, the short threshold voltage TV2S is 1.50 V, the predetermined duration is 75 ns. The reference to V2 in duration D(.), peak level P(.), relaxation duration R(.), and log time L(.) is suppressed in FIG. 7 in order not to obscure the figure. The simulated voltage level, indicated with its signal amplitude S2 along the vertical axis, is indicated as a function of time, as indicated with t along the horizontal axis, with trace 1100 (corresponding to that in FIG. 7). FIG. 8a shows an example wherein the simulated voltage violates the variant of second violation rule three times over the shown period of time. A first violation occurs from time 150 ns to 250 ns with a duration D(n)=250−150=100 ns and peak level P(n)=1.9 V, corresponding to a 40% voltage overshoot of the long threshold voltage TV2L. At time L(n)=250 ns, the violation score of the first violation is calculated from the violation-specific rule associated with the variant of the second violation rule as ΔSc(V2(n))=100 ns×40%=40, and the rule score is updated with the violation score to Sc(V2)=0+40=40 and reported. In this example, the second violation occurs after a relaxation duration R(n+1). During the second violation, the simulated voltage exceeds the short threshold voltage TV2S of 1.50 V. The second violation occurs from time 250 ns to 300 ns, i.e., a duration D(n+1)=50 ns and peak level P(n+1)=1.80 V, corresponding to a 0.30 V voltage overshoot of the short threshold voltage TV2S of 1.50 V, i.e., corresponding to a 20% overshoot of the short threshold voltage TV2S. At time L(n+1), the violation score of the variant of the second violation is calculated as ΔSc(V2(n+1))=50 ns×20%=10, and the rule score of the first violation rule is updated with the violation score to Sc(V2)=40+10=50 and reported. At the end of a subsequent third violation, from time 350 ns to 360 ns, at a peak level P(n+2), corresponding to again a 20% voltage overshoot of the short threshold voltage TV2S, the violation score of the third violation is calculated as ΔSc(V2(n+2))=10 ns×20=2, and the rule score of the variant of the second violation rule is updated with the violation score to Sc(V2)=50+2=52 and reported.

Figure 8B:
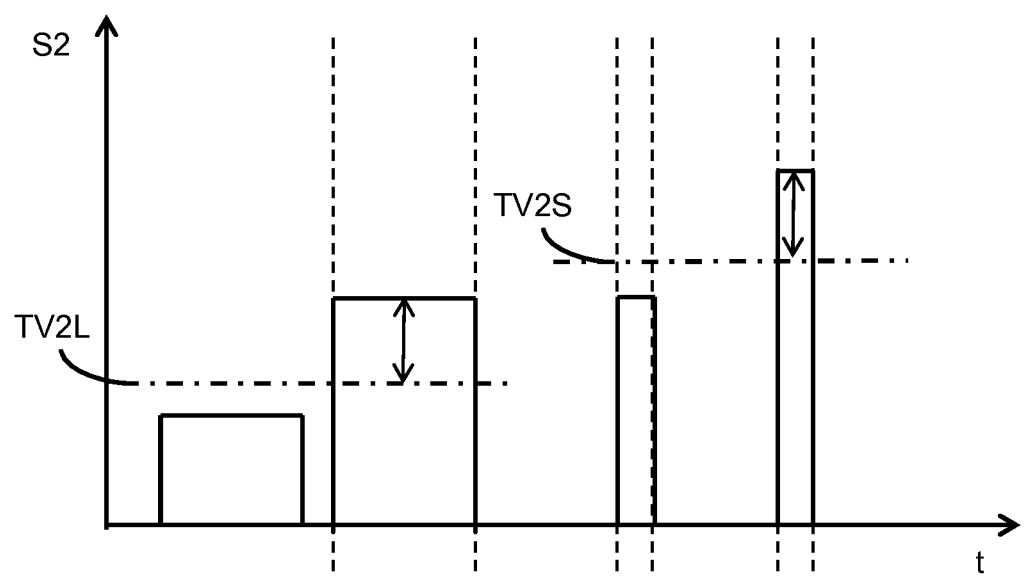

FIG. 8b schematically indicates detecting violations of the variant of the second violation rule, wherein the long threshold voltage TV2L is smaller than the short threshold voltage TV2S. FIG. 8b shows from left to right:

a voltage increase with a duration longer than the predetermined duration and with the voltage remaining below the long threshold voltage TV2L: no violation;

a voltage increase with a duration longer than the predetermined duration and with the voltage exceeding the long threshold voltage TV2L: a violation with an amount as indicated by the double-headed arrow;

a voltage increase with a duration shorter than the predetermined duration and with the voltage remaining below the short threshold voltage TV2S: no violation; and a voltage increase with a duration shorter than the predetermined duration and with the voltage exceeding the short threshold voltage TV2S: a violation with an amount as indicated by the double-headed arrow.

Thus, in the example shown in FIG. 8a and FIG. 8b, if the voltage exceeds the long voltage level threshold TV2L during a violation duration D(.) longer than a predetermined duration, a violation of the variant of the second violation rule is detected and may be reported. Further, if the voltage exceeds the short voltage level threshold TV2S during a violation duration D(.) shorter than the predetermined duration, a violation of the variant of the second violation rule is detected and may be reported. Further, it is determined that the violation rule is not violated if the voltage exceeds the long voltage level threshold TV2L but does not exceed the short voltage level threshold TV2S during a violation duration D(.) shorter than the predetermined duration. Thus, short peaks in the voltage may be tolerated, and the report may consequently not include such violations.

Figure 9A:
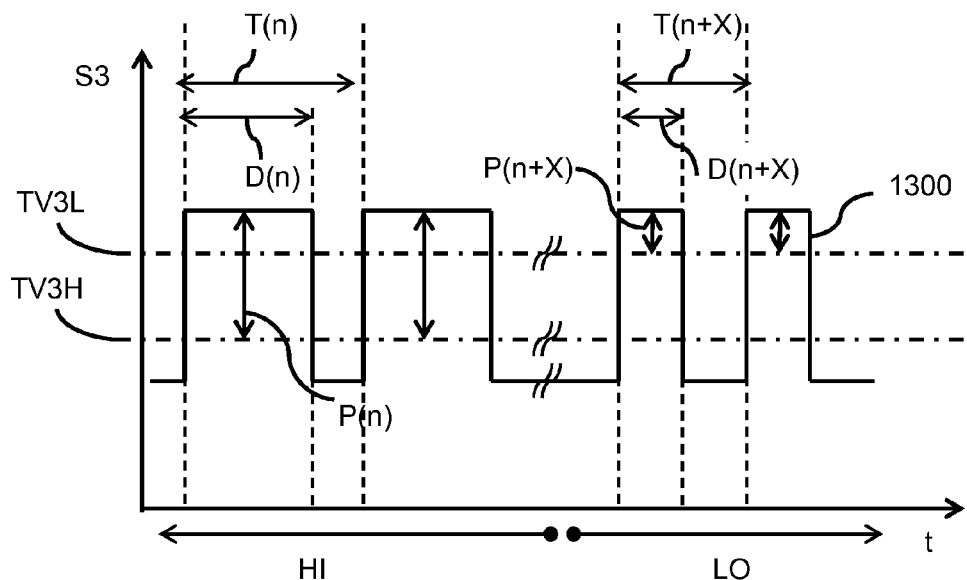

FIG. 9a schematically shows a simplified example of violations of a third violation rule, wherein the third violation rule uses a dynamic threshold. In this example, the threshold for violation rule Vi is determined in dependence on a temporal characteristic of the associated violation, and temporal characteristic corresponds to a duty cycle of a violation of the violation type associated with violation rule Vi.

In this example, the third violation rule V3 relates to a third violation type corresponding to a violation of a high-duty cycle current level threshold TV3H of an analogue current at a node of the device and a low-duty cycle current level threshold TV3L of the analogue current. The high-duty cycle current level threshold TV3H is lower than the low-duty cycle current level threshold TV3L. In this example, the high-duty cycle current level threshold TV3H is used when the duty cycle of the voltage is 50% or larger, whereas the low-duty cycle current level threshold TV3L is used when the duty cycle is lower than or equal to 50%. The reference to V3 in duration D(.), peak level P(.), relaxation duration R(.), and log time L(.) is suppressed in FIG. 9a in order not to obscure the figure. The simulated current level, indicated with its signal amplitude S3 along the vertical axis, is indicated as a function of time, as indicated with t along the horizontal axis, with trace 1300.

FIG. 9a shows that, during a first time span HI, the analogue current shows a periodical behaviour where, during a duration D(n) for every period T(n), i.e., with a relatively high duty cycle δ=D(n)/T(n) of approximately 75%, the analogue current exceeds the high-duty cycle current level threshold TV3H by an overshoot of P(n). During a second time span LO, the analogue current shows a periodical behaviour where, during a duration D(n+X) for every period T(n+X), i.e., with a relatively low duty cycle δ=D(n+X)/T(n+X) of approximately 40%, the analogue current exceeds the low-duty cycle current level threshold TV3L by an overshoot of P(n+X).

Figure 9B:
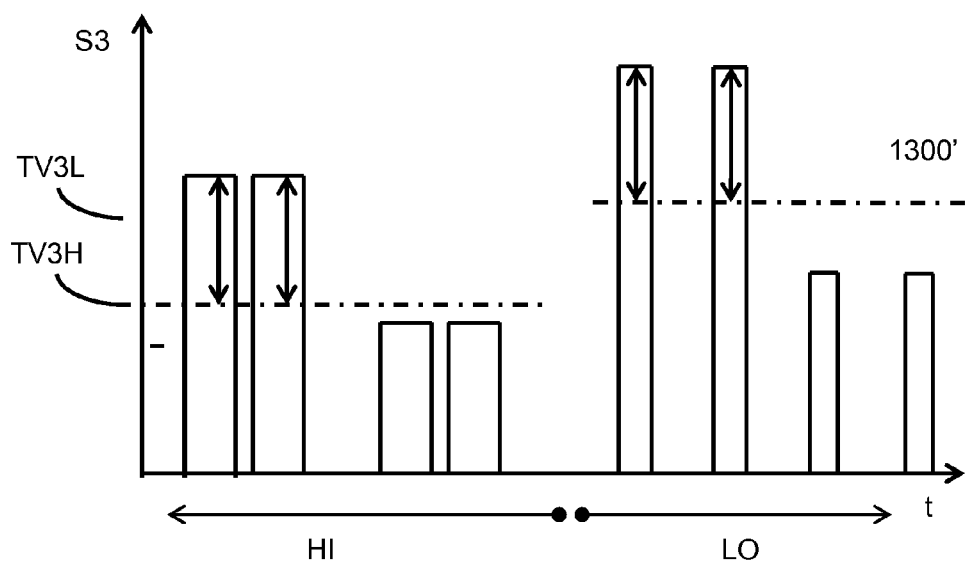

FIG. 9b schematically indicates detecting violations of the third violation rule, wherein the high-duty cycle current level threshold TV3H is smaller than the low-duty cycle current level threshold TV3L. FIG. 9b shows from left to right:
- a voltage increase at a high duty cycle, with the voltage remaining below the high-duty cycle current level threshold TV3H: no violation;
- a voltage increase at a high duty cycle, with the voltage exceeding high-duty cycle current level threshold TV3H: a violation with an amount as indicated by the double-headed arrow;
- a voltage increase at a low duty cycle, with the voltage remaining below the low-duty cycle current level threshold TV3L: no violation; and
- a voltage increase at a low duty cycle, with the voltage exceeding the low-duty cycle current level threshold TV3L: a violation with an amount as indicated by the double-headed arrow.

Figure 10:
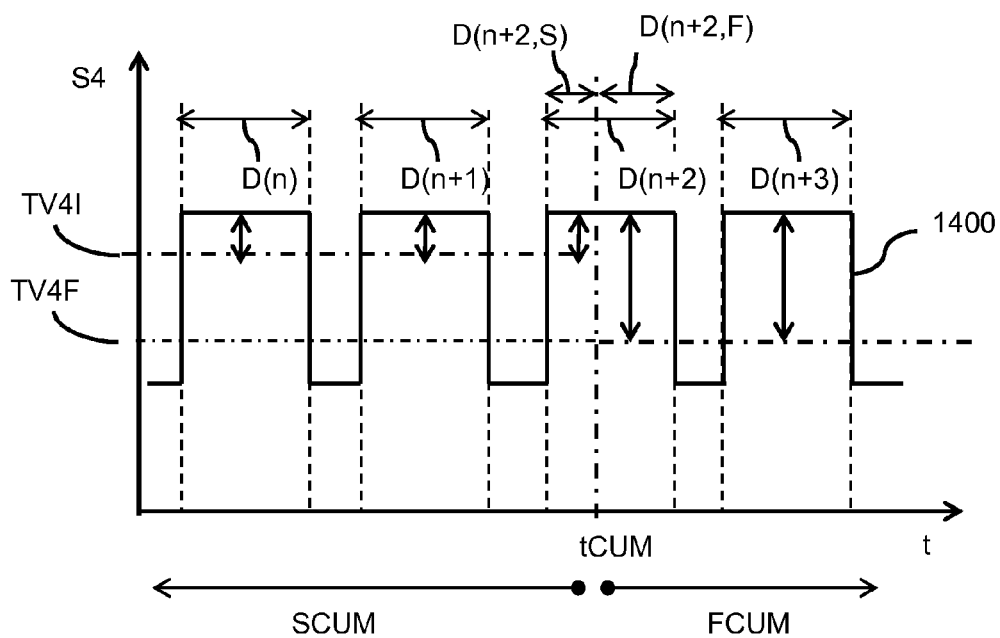

FIG. 10 schematically shows a simplified example of violations of a fourth violation rule Vi, wherein the fourth violation rule Vi uses a dynamic threshold. In this example, the threshold for violation rule Vi is determined in dependence on a temporal characteristic of the associated violation, and temporal characteristic relates to an accumulated duration of one or more violations of the violation type associated with violation rule Vi and the threshold controller 441 may establish a threshold in dependence on the accumulated duration.

In this example, the fourth violation rule V4 relates to a fourth violation type corresponding to a violation of an initial current level threshold TV4I of an analogue current at a node of the device and a further current level threshold TV4F of the analogue current. The initial current level threshold TV4I is larger than the further current level threshold TV4F. In this example, initial current level threshold TV4I is used while the accumulated duration of one or more violations of the violation type associated with violation rule V4 is below an accumulated duration threshold, and the further current level threshold TV4F is used when the accumulated duration is equal to or larger than the accumulated duration threshold. The reference to V4 in duration D(.), peak level P(.), relaxation duration R(.), and log time L(.) is suppressed in FIG. 10 in order not to obscure the figure. The simulated current level, indicated with its signal amplitude S4 along the vertical axis, is indicated as a function of time, as indicated with t along the horizontal axis, with trace 1400. The further current level threshold TV4F is smaller than initial current level threshold TV4I, such that, effectively, the threshold is lowered once the accumulated duration reaches the accumulated duration threshold. Thus, a smaller current overshoot may be held allowable before a violation is detected after the accumulated duration is reached. The method thus tolerates some larger overshoots in an initial part of the simulation than during later parts.

FIG. 10 shows that, during an initial time span SCUM, the analogue current exceeds the initial current level threshold TV4I during a duration D(n) and again during a duration D(n+1). After a first part D(n+2, S) of a next violation of duration D(n+2), the accumulated duration D(1)+ . . . D(n)+D(n+1)+D(n+2, S) exceeds the accumulated duration threshold, and the threshold for detecting further violations of the fourth violation rule is reduced to the further current level threshold TV4F as from the corresponding time tCUM. Thus, during a further time span FCUM after time tCUM, the analogue current is compared to the further current level threshold TV4F to detect further violations: the second part D(n+2, F) of violation n+2 exceeds the further current level threshold TV4F, and may thus contribute for the associated violation score with a relatively larger contribution than the first part D(n+2, S).

Figure 11:
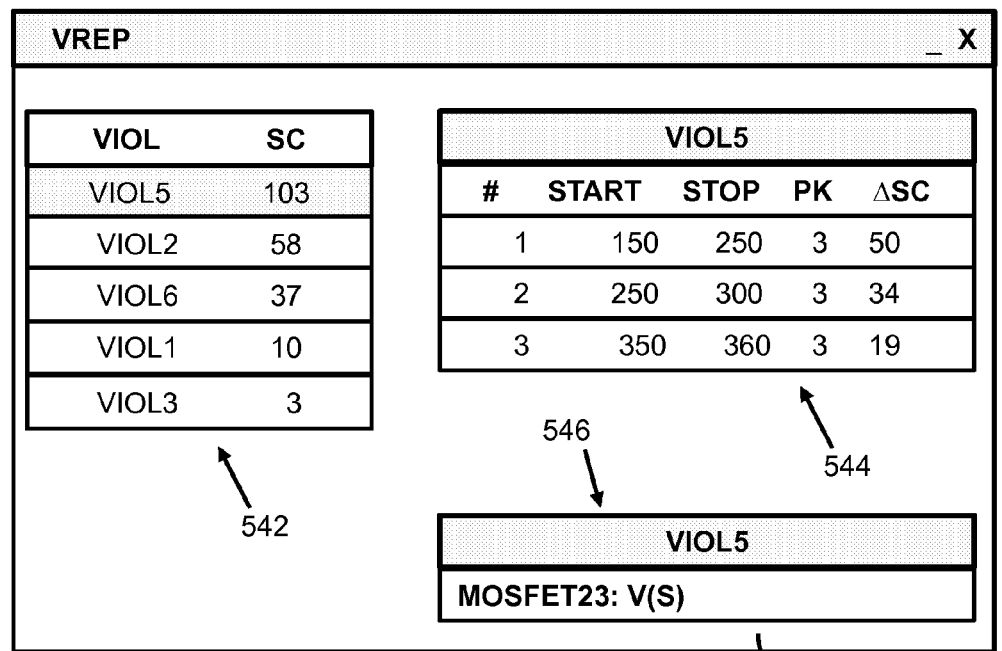
FIG. 11 schematically shows an example of reported scores.

FIG. 11 schematically shows an example of reporting scores on a display 521, as displayed to a designer, using a method as described with reference to FIG. 4 and FIG. 5. FIG. 11 shows a window 540 with a header bar indicating a window title as VREP and symbols "_" and "X" for minimizing or closing the window. The window 540 displays a first list 542 of entries indicating the name of the violation rules, here schematically indicated as VIOL1, . . . VIOL6, for all non-zero rule scores associated with six violation rules V1, . . . , V6. The entries are shown and sorted in order of decreasing rule score. The names of the violation rules may for example provide a textual description of the violation type by referring to the type of simulated parameter, such as "current violation", "voltage violation", "temperature violation". The names of the violation rules may for example alternatively or additionally provide a textual description of the violation type by referring to the type of physical effect, such as "ESD risk", "NBTI risk". In this example, a fifth violation rule V5 named VIOL5 shows the highest rule score, Sc(V5)=103, a second violation rule V2 named VIOL2 has a second-highest rule score (Sc(V2)=58), while violation rule V4 is not shown as it has a score Sc(V4)=0. As indicated with the shading in the first list 542 in FIG. 11, violation rule V5 is selected, and a second list 542 shows the individual violation scores ΔSc of the three violations of violation rule V5 together with the information, representing start and stop time and peak value of these individual scores. Another box 546 indicates that violation rule V5 is associated with a source voltage of a device component labelled "MOSFET32". The designer can thus easily recognize that violation rule V5 has the largest rule score and needs to be addressed with the highest priority. The designer can further recognize that, for this violation rule, violations have occurred with different violation scores, which may be of relevance for the designer in order to improve the device component "MOSFET32". A further window (not shown) may show the circuit layout of the semiconductor device, wherein device component "MOSFET32" is highlighted.

FIG. 12 schematically shows an exemplary user interaction system 2000 having a programmable processor 2005. The user interaction system 2000 is shown to be a personal computer, but may be any type of suitable user interaction system 2000. The programmable processor may comprise one or more components of system 11. The user interaction system 2000 further comprises a storage unit 2007, a user input 2003 and a display 2006, which may be the same as display 521 in FIG. 2 or an additional display. The user input 2003 allows the user to input user data and user instructions 2004 to the processor 2005 by e.g. using a keyboard 2001 or a mouse 2002. Also, although not shown, the display 2006 may comprise a touch-sensitive surface for enabling the user to provide user data and user instructions to the user input 2003 by means of touching the display 2006. The processor 2005 is arranged to perform any one of the methods according to the invention, to receive user data and user instructions 2004, to present visual information on the display 2006 and to communicate with a data I/O device 2009, such as an optical disc drive or a solid state reader/writer. The processor 2005 is arranged to cooperate with the storage unit 2007, allowing storing and retrieving information on the storage unit 2007, such as the violation information of one or more violations, the violation scores and/or the rule scores determined during the execution of the simulation. The user interaction system 2000 may further comprise a communication channel 2008 allowing the processor 2005 to connect to an external cloud 2500 for communicating with other devices in the cloud. The external cloud may e.g. be the Internet. The user interaction system 2000 may allow generation, inspection and further processing of the violation information of one or more violations, the violation scores and/or the rule scores by a user. The processor 2005 may also be arranged to retrieve the violation information of one or more violations, the violation scores and/or the rule scores determined during further executions of the simulation from the storage unit 2007, or from another device in the cloud 2500, and generate a report by the processor 2005. The processor 2005 may be capable to read, using the data I/O device 2009, a computer readable medium comprising a program code. The processor 2005 may be capable to read, using the data I/O device 2007, a computer readable medium comprising a computer program product comprising instructions for causing the user interaction system 2000 to perform a method of testing a simulation of a device against new or more violation rules using a device design, a component library and a simulation scenario, the method comprising: executing the simulation of the device using the device design, the component library and the simulation scenario; detecting, for each violation rule of the plurality of violation rules, a violation of the respective violation rule during the executing of the simulation and determining information representing the violation of the respective violation rule; calculating, for each violation rule of the plurality of violation rules, a violation score in dependence on the information representing the violation of the respective violation rule during the executing of the simulation; determining, for each violation rule of the plurality of violation rules, a respective rule score from the violation scores during the simulation; preparing a report of the rule scores associated with the one or more violation rules. The report may be reported to the user as visual information on the display and/or written to a log file and/or displayed on the display.

FIG. 13 shows a computer readable medium 3000 comprising a computer program product 3100, the computer program product 3100 comprising instructions for causing a processor apparatus to perform a method of testing a simulation of a device against new or more violation rules using a device design, a component library and a simulation scenario, the method comprising: executing the simulation of the device using the device design, the component library and the simulation scenario; detecting, for at least one violation rule of the plurality of violation rules, a violation of the respective violation rule during the executing of the simulation and determining information representing the violation of the respective violation rule, wherein at least one detecting the one or more violations comprises comparing a simulated parameter against a threshold; and determining the threshold for the respective violation rule in dependence on a temporal characteristic of the associated violation. The computer program product 3100 may further comprise calculating, for each violation rule of the plurality of violation rules, a violation score in dependence on the information representing the violation of the respective violation rule during the executing of the simulation; and determining, for each violation rule of the plurality of violation rules, a respective rule score from the violation scores during the simulation. The computer program product 3100 may further comprise instructions for causing the processor apparatus to perform preparing a report of the rule scores associated with the one or more violation rules. The computer program product 3100 may be embodied on the computer readable medium 3000 as physical marks or by means of magnetization of the computer readable medium 3000. However, any other suitable embodiment is conceivable as well. Furthermore, it will be appreciated that, although the computer readable medium 3000 is shown in FIG. 13 as an optical disc, the computer readable medium 3000 may be any suitable computer readable medium, such as a hard disk, solid state memory, flash memory, etc., and may be non-recordable or recordable.

FIG. 14 shows another computer readable medium 4000 comprising another computer program product 4100, the computer program product 4100 comprising a violation monitor library component for use in a simulation of a performance of a device component on a processor system, the violation monitor library component comprising instructions for causing the processor system to perform detecting a violation of a violation rule during the executing of the simulation; determining information representing the violation of the violation rule during the executing of the simulation during the executing of the simulation. The violation monitor library component may further comprise instructions for causing the processor system to perform calculating a violation score in dependence on the information representing the violation of the violation rule during the executing of the simulation; determining a rule score from the violation score during the executing of the simulation; and providing the rule score to a program function executing the violation monitor library component. The computer program product 4100 may be embodied on the computer readable medium 4000 as physical marks or by means of magnetization of the computer readable medium 4000. However, any other suitable embodiment is conceivable as well. Furthermore, it will be appreciated that, although the computer readable medium 4000 is shown in FIG. 14 as an optical disc, the computer readable medium 4000 may be any suitable computer readable medium, such as a hard disk, solid state memory, flash memory, etc., and may be non-recordable or recordable. The computer program product 4100 thus comprises a violation monitor library component, which may be used in a device simulation. The violation monitor library component may be a standalone library component, or integrated in a device library component, representing a simulation of a performance of a device or a device component. Thus, in an embodiment, the violation monitor library component is part of a device library component arranged to simulate the device component. In another embodiment, the violation monitor library component is arranged to cooperate with a device library component arranged to simulate the device component.

The invention may thus be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, other formulas may be used for the calculation of the violation score ΔSc and/or the calculation of the rule score Sc. For example, the connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 12 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received from elements of system 11, for example, from computer readable media such as memory 2007 or other media on other computer systems. Such computer readable media may be permanently, removably or remotely coupled to an information processing system such as system 11. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, system 11 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A simulation system for testing a simulation of a device against one or more violation rules, the simulation system comprising:
   a device simulator for executing the simulation of the device using a device design, a device model and a simulation scenario; and
   one or more violation monitors, one violation monitor for each violation rule, wherein at least one of the violation monitors comprising:
      a violation information detector for detecting one or more violations of the respective violation rule of the one or more violation rules during the executing the simulation of the device and, for each violation, determining information representing the respective violation of the one or more violations, wherein the detecting the one or more violations comprises comparing a simulated parameter against a threshold, and
      a threshold controller for determining the threshold for the respective violation rule in dependence on a temporal characteristic of a violation associated with the respective violation rule.

2. The simulation system according to claim 1, the temporal characteristic relating to a duration of a violation associated with the respective violation rule, and the threshold controller being arranged to establish the threshold in dependence on the duration of the violation associated with the respective violation rule.

3. The simulation system according to claim 1, the temporal characteristic relating to a duty cycle of a violation associated with the respective violation rule, and the threshold controller being arranged to establish the threshold in dependence on the duty cycle of the violation associated with the respective violation rule.

4. The simulation system according to claim 1, the temporal characteristic relating to an accumulated duration of one or more violations of the respective violation rule, and the threshold controller being arranged to establish the threshold in dependence on the accumulated duration.

5. The simulation system according to claim 1, further comprising a reporting unit for preparing a report of the information associated with the one or more violation rules.

6. The simulation system according to claim 1, wherein each violation monitor comprising:
   a violation information detector for detecting one or more violations of the respective violation rule during the executing of the simulation of the device and, for each violation, determining information representing the respective violation,
   a violation score unit for calculating, for each violation of the respective violation rule, a violation score in dependence on the information representing the respective violation and on a violation rule-specific scheme, and
   a rule score unit for determining, for the respective violation rule, a rule score from the violation scores of the one or more violations during the simulation of the device.

7. The simulation system according to claim 6, further comprising a reporting unit for preparing a report of the rule scores associated with the one or more violation rules.

8. The simulation system according to claim 7, the reporting unit being arranged to perform a filtering and/or a sorting on the rule scores in preparing the report.

9. The simulation system according to claim 6, each violation rule being associated with a violation of a different violation type of a plurality of violation types, the calculating a violation score uses a weighting factor dependent on the different violation type.

10. The simulation system according to claim 6, the information comprising at least a first violation parameter and a second violation parameter of a violation parameter group comprising a violation start time, a violation stop time, a violation duration, a violation count, a violation peak amplitude and a violation relaxation duration relative to a preceding violation,
    each violation score being calculated using a violation rule-specific function of at least the first violation parameter and the second violation parameter.

11. A method of testing a simulation of a device against one or more violation rules, the method comprising:
    providing a device design, a component library and a simulation scenario;
    executing the simulation of the device using the device design, the component library and the simulation scenario;
    detecting, for each violation rule of a plurality of violation rules, one or more violations of respective violation rule of the one or more violation rules during the executing the simulation of the device and determining information representing the respective violation of the one or more violations, wherein the detecting the one or more violations comprises comparing a simulated parameter against a threshold; and
    determining the threshold for the respective violation rule in dependence on a temporal characteristic of a violation associated with said respective violation rule.

12. The method according to claim 11, the temporal characteristic relating to one of:
    a duration of a violation associated with the respective violation rule,
    a duty cycle of a violation associated with the respective violation rule,
    an accumulated duration of one or more violations of the respective violation rule.

13. The method according to claim 11, the method further comprising:
    calculating, for each violation of each violation rule of the plurality of violation rules, a violation score in dependence on the information representing the respective violation of the respective violation rule during the executing the simulation of the device; and determining, for the each violation rule of the plurality of violation rules, a respective rule score from the violation scores of the one or more violations during the simulation of the device.

14. The method according to claim 13, further comprising preparing a report of the information associated with the one or more violation rules and/or of the rule scores associated with the one or more violation rules.

15. The method according to claim 14, further comprising reporting the report.

16. The method according to claim 14, the preparing a report comprising filtering and/or a sorting of the rule score.

17. The method according to claim 14, further comprising writing the report into a log file and/or presenting the report on a display for presenting the report to a user.

18. The method according to claim 13, each violation rule being associated with a violation of a different violation type of a plurality of violation types, the calculating a violation score using a weighting factor dependent on the different violation type.

19. The method according to claim 11, the detecting comprising detecting at least a first violation parameter and a second violation parameter of a violation parameter group comprising a violation start time, a violation stop time, a violation duration, a violation count, a violation peak amplitude and a violation relaxation duration relative to a preceding violation,
the information comprising at least the first violation parameter and the second violation parameter as detected, and
each violation score being calculated using a violation rule-specific function of at least the first violation parameter and the second violation parameter.

20. A tangible non-transitory computer readable media comprising instructions for causing a processor system to perform a method of testing a simulation of a device against one or more violation rules using a device design, a component library and a simulation scenario, the method comprising:
executing the simulation of the device using the device design, the component library and the simulation scenario;
detecting, for each violation rule of the one or more violation rules, a violation of the respective violation rule of the one or more violation rules during the executing the simulation of the device and determining information representing the violation of the respective violation rule, wherein the detecting a violation of the respective violation rule comprises comparing a simulated parameter against a threshold; and
determining the threshold for the respective violation rule in dependence on a temporal characteristic of a violation associated with the respective violation rule.

* * * * *